United States Patent
Liu et al.

(10) Patent No.: US 9,269,837 B2
(45) Date of Patent: Feb. 23, 2016

(54) CHIP PACKAGE AND METHOD OF MANUFACTURING THE SAME

(71) Applicant: XINTEC INC., Taoyuan (TW)

(72) Inventors: Tsang-Yu Liu, Zhubei (TW); Shu-Ming Chang, New Taipei (TW); Po-Han Lee, Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/682,888

(22) Filed: Apr. 9, 2015

(65) Prior Publication Data
US 2015/0295097 A1    Oct. 15, 2015

(30) Foreign Application Priority Data

Apr. 9, 2014   (TW) .............................. 103113044 A

(51) Int. Cl.
| H01L 23/00 | (2006.01) |
| H01L 31/0203 | (2014.01) |
| H01L 31/18 | (2006.01) |
| H01L 31/02 | (2006.01) |
| H01L 23/31 | (2006.01) |
| H01L 23/48 | (2006.01) |

(52) U.S. Cl.
CPC ........ *H01L 31/0203* (2013.01); *H01L 23/3128* (2013.01); *H01L 23/481* (2013.01); *H01L 24/12* (2013.01); *H01L 31/02005* (2013.01); *H01L 31/18* (2013.01); *H01L 2224/73253* (2013.01)

(58) Field of Classification Search
CPC ................. H01L 23/3128; H01L 2224/73253; H01L 23/481; H01L 24/12
See application file for complete search history.

(56) References Cited

U.S. PATENT DOCUMENTS

| 2011/0169139 | A1* | 7/2011 | Lin | ........................ | H01L 23/481 257/621 |
| 2011/0175221 | A1* | 7/2011 | Ni | ........................ | B81B 7/0051 257/737 |
| 2012/0012988 | A1* | 1/2012 | Huang | .................. | B81B 7/0077 257/632 |
| 2013/0187246 | A1* | 7/2013 | Adkisson | ................. | H03H 9/64 257/416 |

* cited by examiner

*Primary Examiner* — Ngan Ngo
(74) *Attorney, Agent, or Firm* — Liu & Liu

(57) ABSTRACT

A chip package includes semiconductor chips, inner spacers, cavities, conductive portions and solder balls. The semiconductor chip has at least an electronic component and at least an electrically conductive pad disposed on an upper surface thereof. The conductive pad is arranged abreast to one side of the electronic component and electrically connected thereto. The cavities open to a lower surface of the semiconductor chip and extend toward the upper surface to expose the conductive pad on the upper surface. The conductive portions fill the cavities from the lower surface and electrically connected the to conductive pad. The solder balls are disposed on the lower surface and electrically connected to the conductive portions. A gap is created between an outer wall of the inner spacers and an edge of the semiconductor chip.

8 Claims, 5 Drawing Sheets

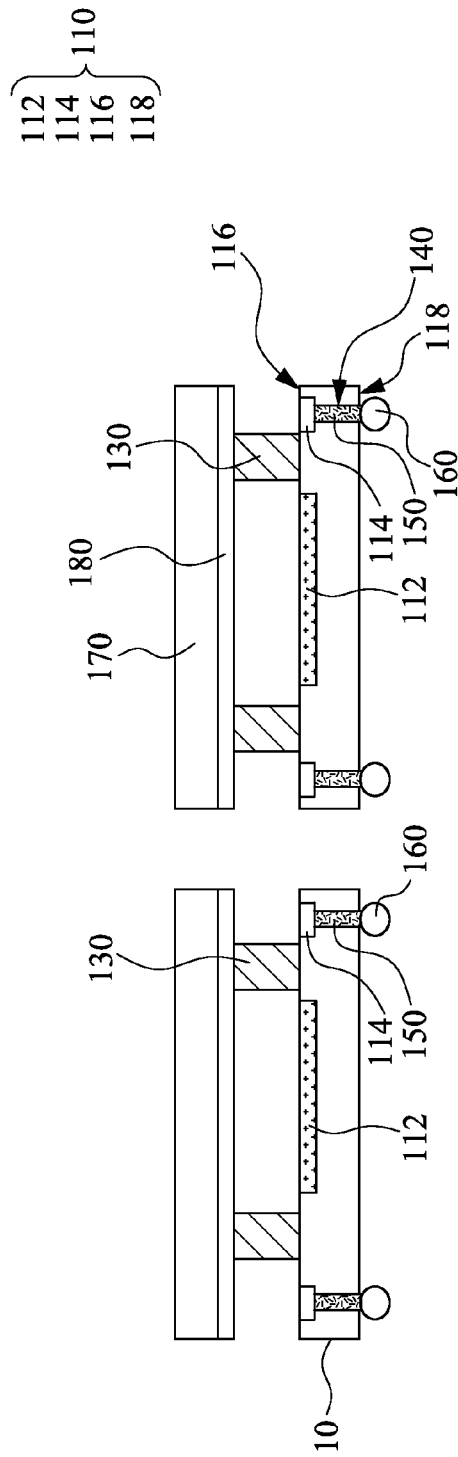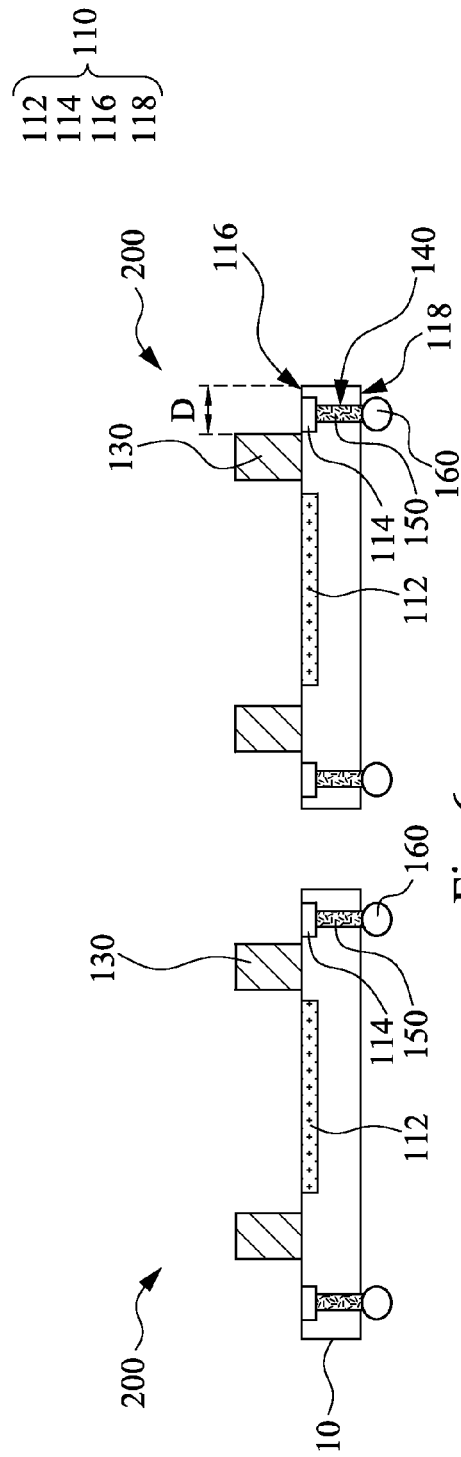

CHIP PACKAGE AND METHOD OF MANUFACTURING THE SAME

RELATED APPLICATIONS

This application claims priority to Taiwanese Application Serial Number 103113044, filed Apr. 9, 2014, which is herein incorporated by reference.

BACKGROUND

1. Field of Invention

The present invention relates to a packaging and method of manufacturing the same. More particularly, the present invention relates to a chip packaging and method of manufacturing the same.

2. Description of Related Art

Wafer level chip scale packaging is an advanced way of semiconductor chip packaging. It refers to a process that after all the chips on a wafer are complete, the packaging and evaluation are carried out to every chip on the wafer altogether. After that, the wafer is diced to form a single chip package. The size of a semiconductor chip is ever compact and the wire distribution is much denser. In this case, chip package is more complicated in structure design and manufacture process. The requirement of the electronic components on the chip package, especially its precision and high sensitivity, is tougher. Therefore in the manufacturing process any source of contamination should be eliminated to protect those electronic components. Otherwise their functionality may be compromised. However, maintaining a sterile condition requires great investment in factory equipment, and the manufacturing cost increases as well. Furthermore, mass production is prone to lower yielding rate and product contamination. Accordingly, a more reliable, mass production suitable chip package manufacturing process is an urgent issue in this industry.

SUMMARY

The instant disclosure provides a wafer level chip package and method of manufacturing the same to protect the electronic components in the package and has lower manufacturing cost for mass production. The method includes the formation of an outer spacer and a plurality of inner spacers. The outer and inner spacers are separated from each other. The outer spacer is disposed between each of the semiconductor chips to distinguish every chip on the semiconductor wafer. The outer spacer also corresponds to a position where a cutting line goes through. Each of the semiconductor chips has inner spacers surrounding the electronic component on the semiconductor chip. In the manufacturing process, a protection lid is disposed on top of the outer and inner spacers such that the electronic component on the semiconductor chip is isolated in an compartment defined by the protection lid, inner and outer spacers. The electronic component on the semiconductor chip can then be spared from contamination of damage in the manufacturing process. In addition, the outer and inner spacers can sustain certain mechanical pressure in the step of dicing semiconductor chips. In the presence of the spacers, the protection lid will not distort wildly because of strong external force, and therefore the electronic component is saved from being harshly pressed against by the protection lid.

According to an embodiment of the instant disclosure, the method of manufacturing chip package includes providing a semiconductor wafer having a plurality of semiconductor chips. The semiconductor chips are arranged in an array, each of which has at least an electronic component and at least an electrically conductive pad disposed on an upper surface of the semiconductor chip. The conductive pad is arranged abreast to one side of the electronic component and electrically connected to the electronic component. Next, an outer spacer and a plurality of inner spacers are formed on the semiconductor wafer. The outer spacer separates each of the semiconductor chips, each of the inner spacers surrounds the electronic component on each of the semiconductor chips. Then, a protection lid is formed and disposed on the outer spacer and the inner spacers. Subsequently, a plurality of cavities is formed on each of the semiconductor chips from a lower surface thereof to expose the conductive pad disposed on the upper surface of the semiconductor chip. Following that, a plurality of conductive portions is formed and fills each of the cavities and electrically connected to each of the conductive pads. In the next stage, a plurality of solder balls is disposed on the lower surface and electrically connected to each of the conductive portions. Finally, the semiconductor chips are separated by cutting along a plurality of cutting lines between each of the semiconductor chips. The outer spacer and the inner spacers are separate, and the cutting lines goes through the outer spacer alone.

In an embodiment of the instant disclosure, in the step of forming the outer spacer and inner spacers on the semiconductor wafer, the outer spacer and inner spacer flank the conductive pad from either side.

In an embodiment of the instant disclosure, a predetermined width of the cutting lines is larger than a width of the outer spacer.

In an embodiment of the instant disclosure, after the step of cutting along the plurality of cutting lines between each of the semiconductor chips, the method further includes removing the protection lid from each of the semiconductor chips.

In an embodiment of the instant disclosure, in the step of forming the outer spacer and the plurality of inner spacers on the semiconductor wafer, the outer spacer and the inner spacers are formed simultaneously, and the material of the outer spacer and the inner spacers includes a thermal curing material, a UV curing material or the combination thereof.

In an embodiment of the instant disclosure, the thermal curing material includes epoxy.

In an embodiment of the instant disclosure, the electronic component is a light sensitive element.

According to an embodiment of the instant disclosure, the chip package includes a semiconductor chip, an inner spacer, a cavity, a conductive portion and a solder ball. The semiconductor chip has at least an electronic component and at least an electrically conductive pad disposed on an upper surface of the semiconductor chip. The conductive pad is arranged abreast to one side of the electronic component and electrically connected thereto. The inner spacer is disposed on the upper surface and surrounds the electronic component. The cavity opens on a lower surface of the semiconductor and exposes the conductive pad that is disposed on the upper surface. The conductive portion fills the cavity and is electrically connected to the conductive pad. The solder ball is disposed on the lower surface and electrically connected to the conductive portion. A gap is created between one side of the inner spacer and an edge of the semiconductor chip.

In an embodiment of the instant disclosure, the inner spacer is disposed between the electronic component and the conductive pad.

In an embodiment of the instant disclosure, the inner spacer is made of a thermal curing material, a UV curing material of the combination thereof.

In an embodiment of the instant disclosure, the thermal curing material is epoxy.

In an embodiment of the instant disclosure, the electronic component is a light sensitive element.

According to an embodiment of the instant disclosure, a wafer level chip package includes a semiconductor wafer, an outer spacer, a plurality of inner spacer, a protection lid, a plurality of cavities, a plurality of conductive portions and a plurality of solder balls. The semiconductor wafer has a plurality of semiconductor chips. The semiconductor chips are arranged in an array, each of which has at least an electronic component and at least an electrically conductive pad disposed on an upper surface of the semiconductor chip. The conductive pad are arranged at one side of the electronic component and electrically connected thereto. The outer spacer is disposed on the semiconductor wafer, and the outer spacer separates each of the semiconductor chips. The inner spacers are respectively disposed on each of the semiconductor chips and surround the electronic component. The protection lid is disposed on the outer and inner spacers. The cavities open on a lower surface of the semiconductor chip and expose the conductive pad that is disposed on the upper surface. The conductive portions fill the cavities and are electrically connected to the conductive pads. The solder balls are disposed on the lower surface and electrically connected to each of the conductive portions. The outer spacer and the inner spacers are separate.

In an embodiment of the instant disclosure, the wafer level chip package further includes an adhesive layer sandwiched between the protection lid and the outer and inner spacers.

In an embodiment of the instant disclosure, the adhesive layer has UV glue.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 4 to 6 are cross-sectional views of different stages in the manufacturing process in accordance with an embodiment of the instant disclosure.

DETAILED DESCRIPTION

Figure 1:
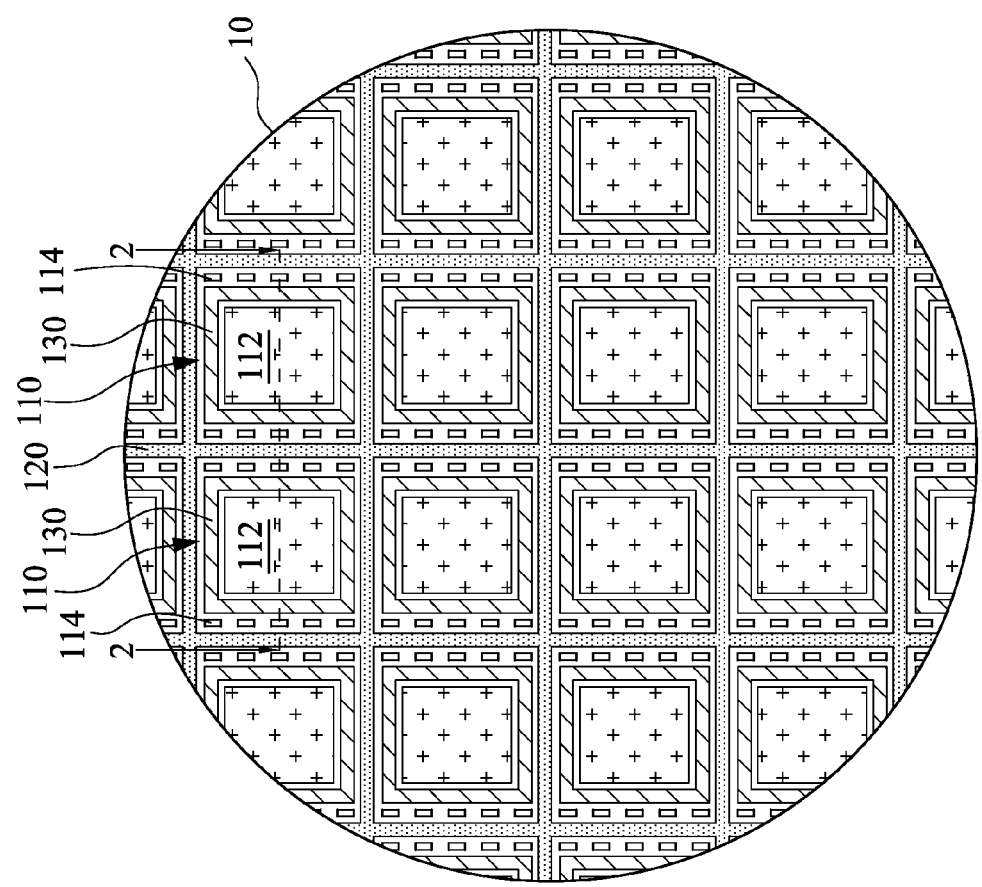
FIG. 1 is a top view of a wafer level chip package in accordance with an embodiment of the instant disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
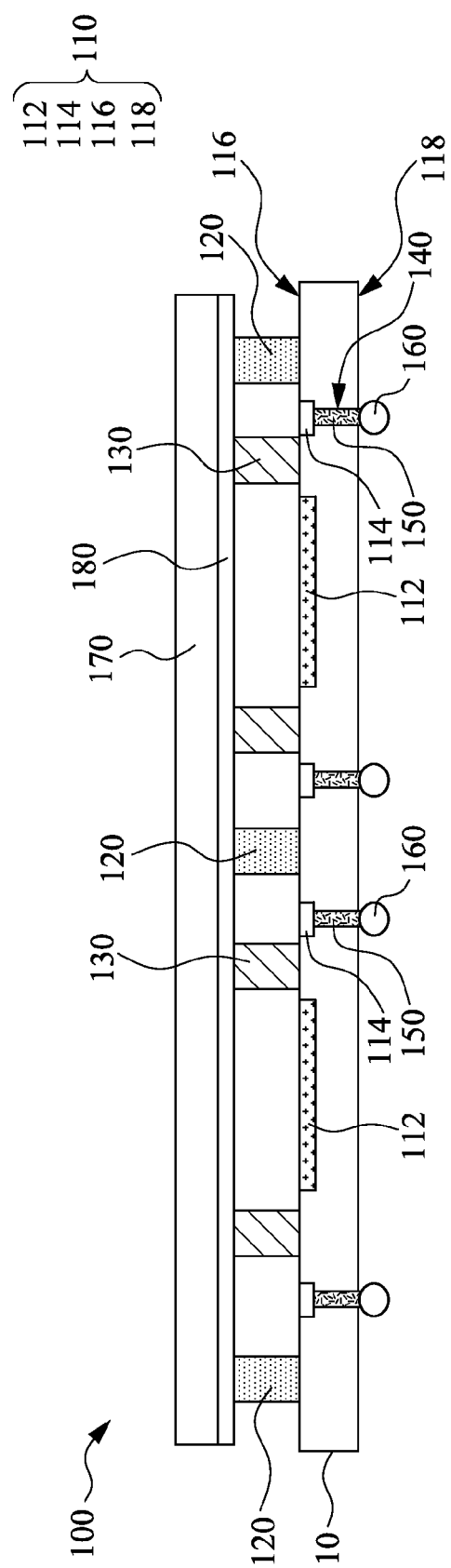
FIG. 2 is a cross-sectional view alone line 2 in FIG. 1 in accordance with an embodiment of the instant disclosure.

FIG. 1 is a top view of a wafer level chip package in accordance with an embodiment of the instant disclosure. FIG. 2 is a cross-sectional view along line 2 in FIG. 1. Please refer to FIGS. 1 and 2. The method of manufacturing chip package includes providing a semiconductor wafer 10 that has a plurality of semiconductor chips 110. The semiconductor chips 110 are arranged in an array, and each of the semiconductor chips 110 has at least an electronic component 112 and at least an electrically conductive pad 114 disposed on an upper surface 116 of the semiconductor chip 110. The conductive pad 114 is arranged abreast to one side of the electronic component 112 and electrically connected thereto. The semiconductor wafer 10 may be, for example, semiconductor wafer includes silicon, germanium or group III-V elements, and the instant disclosure is not limited thereto. As shown in FIG. 1, the semiconductor wafer 10 has arrayed semiconductor chips 110, each of the semiconductor chips 110 has electronic component 112, and the electronic component 112 is electrically connected to the conductive pas 114. In an embodiment of the instant disclosure, the electronic component 112 may be light sensitive element; however, the instant disclosure is not limited thereto. The electronic component 112 may be, for example, active element, passive element, digital circuit, analogue circuit, electronic components of integrated circuit, micro electro mechanical systems, micro fluidic systems, physical sensor using the change in heat or pressure to perform detection, RF circuit, accelerators, gyroscopes, micro actuators, surface sonic element, pressure sensor or the like. As shown in FIG. 1, the conductive pad 114 is disposed on both sides of the electronic component 112 and electrically connected thereto. The electrical connection may be established by interconnection structure (not shown) within the semiconductor chip 110 such that the conductive pad 114 in the periphery area of the semiconductor chip 110 can be electrically connected to the electronic component 112 in the active area of the semiconductor chip 110. Under this arrangement, the conductive pad 114 can act as the input/output signal control end of the electronic component 112 and undergo signal regulation to the electronic component 112 of each of the semiconductor chip 110. The material of the conductive pad 114 may be, for example, aluminium, copper, nickel or any other suitable materials.

Please refer to FIGS. 1 and 2. Subsequently, the outer spacer 120 and the inner spacers 130 are formed on the semiconductor wafer 10. The outer spacer 120 separates each of the semiconductor chips 110, while the inner spacers 130 surround the electronic component 112 of each of the semiconductor chips 110. In an embodiment of the instant disclosure, in the step of forming the outer and inner spacers 120, 130 on the semiconductor wafer 10, the outer spacer 120 and inner spacers 130 are formed simultaneously. The outer and inner spacers 120, 130 have thermal curing material, UV curing material or the combination thereof. The thermal curing material includes epoxy. In more detail, the outer and inner spacers 120, 130 may be formed by firstly screen printed on the entire semiconductor wafer 10 as shown in FIG. 1 with epoxy or any other suitable thermal curing, UV materials. Alternatively, epoxy or any other suitable materials can be coated or deposited on the entire semiconductor wafer 10 first, and then the wafer undergoes baking or UV light exposure to cure or semi-cure the epoxy on the wafer. Subsequently, the pattern as shown in FIG. 1 is formed by photolithography etch or any other suitable process. As shown in FIG. 1, the outer spacer 120 is disposed between each of the semiconductor chips 110 to separate them. The position of the outer spacer 120 corresponds to where a cutting line SL goes later at dicing. Each of the semiconductor chips 110 has inner spacer 130 surrounds the electronic component 112 thereon. It should be noted that, as shown in FIGS. 1 and 2, the outer spacer 120 and the inner spacer 130 are separate from each other. In other words, the outer spacer 120 and the inner spacer 130 are independent to each other without connection. In addition, as shown in FIGS. 1 and 2, in the step of outer and inner spacers 120, 130 formation, the outer spacer 120 and the inner spacer 130 are placed on either side of the conductive pad 114. As a result, the outer spacer 120 provides mechanical support in the following process so does the inner spacer 130. In the presence of the outer and inner spacers 120, 130, the protection of the electronic component 112 of the semiconductor chip 110 is enhanced.

Please refer to FIG. 2. Next, the protection lid 170 is formed on the outer and inner spacers 120, 130. The protection lid 170 may be, for example, glass substrate, high-molecule substrate or blank silicon wafer, and the instant disclosure is not limited thereto. As shown in FIG. 2, the protection lid 170 covers the top of the outer and inner spacers 120, 130 such that the electronic component 112 of the semiconductor chip 110 is shielded in a compartment defined by the protection lid 170 and the inner spacers 130. Therefore, it prevents the electronic component 112 from contamination or damage in the manufacturing process. Further to the abovementioned, when dicing the semiconductor wafer 10, the outer and inner spacers 120, 130 provides extra strength to sustain mechanical force such that the protection lid 170 will not distort because of external force in cutting, and the electronic component 112 will be spared from any damage caused by protection lid 170 distortion. In particular, because the inner spacers 130 stand close to the electronic component 112 on the active area, they provide immediate supporting so as to ensure the integrity of the electronic component 112 from the compression caused by the protection lid 170 distortion. In addition, as shown in FIG. 2, an adhesive layer 180 may be formed before the protection lid 170 covers the top of the outer spacer 120 and the inner spacers 130. The adhesive layer 180 allows the protection lid 170 being firmly attached to the outer and inner spacers 120, 130. The adhesive layer 180 may be, for example, UV glue or any other suitable adhesive material. After one cycle, the adhesive layer 180 can be released by exposure to light or heating such that the protection lid 170 can be easily removed.

Please refer to FIG. 2. After the protection lid 170 is disposed on top of the outer and inner spacers 120, 130, the cavities 140 are formed and open to the lower surface 118 of the semiconductor chip 110 and expose the conductive pad 114 on the upper surface 116. The cavity 140 is formed by photolithography etching or laser drilling from the lower surface 118 toward the upper surface 116 of the semiconductor chip 110 and is aligned with the conductive pad 114. In other words, the cavity 140 allows access to the conductive pad 114 that is the signal regulation input/output end for electrical path establishment. Furthermore, an insulation layer (not shown) may be formed on the lower surface 118 and a portion of the cavity 140. The insulation layer has a gap to expose the conductive pad 114. The insulation layer may be made of silicon oxide, silicon nitride, silicon oxynitride or other suitable insulation materials. The insulation film is laminated on the lower surface 118 and the wall of the cavity 140 by chemical vapour deposition, and the film is photolithography etched to form a gap that exposes the conductive pad 114. Then, the conductive portions 150 fill the cavities 140 from the lower surface 118 and are electrically connected to each of the conductive pads 114. The conductive portions 150 may be made of aluminium, copper or any other suitable conductive materials. The conductive portions 150 are formed by sputtering or evaporation, conforming to the lower surface 118, cavity 140 and over the conductive pad 114. The conductive film is then photolithography etched to a predetermined pattern as the conductive portions 150. However, the instant disclosure is not limited thereto. Moreover, a packaging layer (not shown) can coat the conductive portions 150 to prevent the conductive portions 150 from moisture or other contaminant which may lead to deterioration. The packaging material may be solder mask or any other suitable packaging materials. The packaging layer conformingly coats the lower surface 118 of the semiconductor chip 110 and the conductive portions 150. Subsequently, conductive structures 160 are disposed on the lower surface 118, each of which is electrically connected to the conductive portions 150. In some embodiments, the conductive structures are solder balls. The material of the solder balls 160 may be, for example, tin or any other soldering suitable metal or alloy. The solder balls 160 act as bridge between the chip package 100 to external printed circuit board or interposer. The input/output signals from the printed circuit board or interposer can be transmitted through the solder balls 160, conductive portions 150 to the conductive pads 114 that are electrically connected to the electronic component 112. The signal input/output regulation of the electronic component 112 can then be controlled by the external printed circuit board or interposer. So far the wafer level chip package 100 as shown in FIG. 2 is complete.

Please refer to FIG. 2. The wafer level chip package 100 in accordance with an embodiment of the instant disclosure includes a semiconductor wafer 10, an outer spacer 120, inner spacers 130, a protection lid 170, cavities 140, conductive portions 150 and solder balls 160. The semiconductor wafer 10 has the plurality of semiconductor chips 110. As shown in FIGS. 1 and 2, the semiconductor chips 110 are arranged in an array. Each of the semiconductor chips 110 has an electronic component 112 and a conductive pad 114 disposed on an upper surface 116 of the semiconductor chip 110. The conductive pad 114 is arranged abreast to one side of the electronic component 112 and electrically connected thereto. The outer spacer 120 is disposed on the semiconductor wafer 10 and separates each of the semiconductor chips 110. The inner spacers 130 are disposed on the upper surface of the semiconductor chip 110 and surround the electronic component 112. The protection lid 170 is disposed on the outer and inner spacers 120, 130. The cavities 140 open on the lower surface 118 of the semiconductor chip 110 and expose the conductive pads 114 on the upper surface 116. The conductive portions 150 fill the cavities 140 from the lower surface 118 and are electrically connected to the conductive pads 114. The solder balls 160 are disposed on the lower surface 118 and electrically connected to each of the conductive portions 150. The material and method of making the semiconductor wafer 10, outer spacer 120, inner spacers 130, protection lid 170, cavities 140, conductive portions 150 and solder balls 160 are identical to the abovementioned and omitted herein to avoid repetition. It should be noted that, as shown in FIGS. 1 and 2, the outer spacer 120 and the inner spacer 130 are separate from each other. In other words, the outer spacer 120 and the inner spacer 130 are independent to each other without connection. The outer spacer 120 provides mechanical support in the following process so does the inner spacer 130. In the presence of the outer and inner spacers 120, 130, the protection of the electronic component 112 of the semiconductor chip 110 is greatly enhanced. In addition, as shown in FIGS. 1 and 2, the wafer level chip package 100 may further include an adhesive layer 180 sandwiched between the protection lid 170 and the outer and inner spacers 120, 130. The adhesive layer 180 may include, for example, UV glue or other suitable adhesive material. After one cycle, the adhesive layer 180 is exposed to light or heated to weaken its adhesion so as to remove the protection lid 170.

Figure 3:
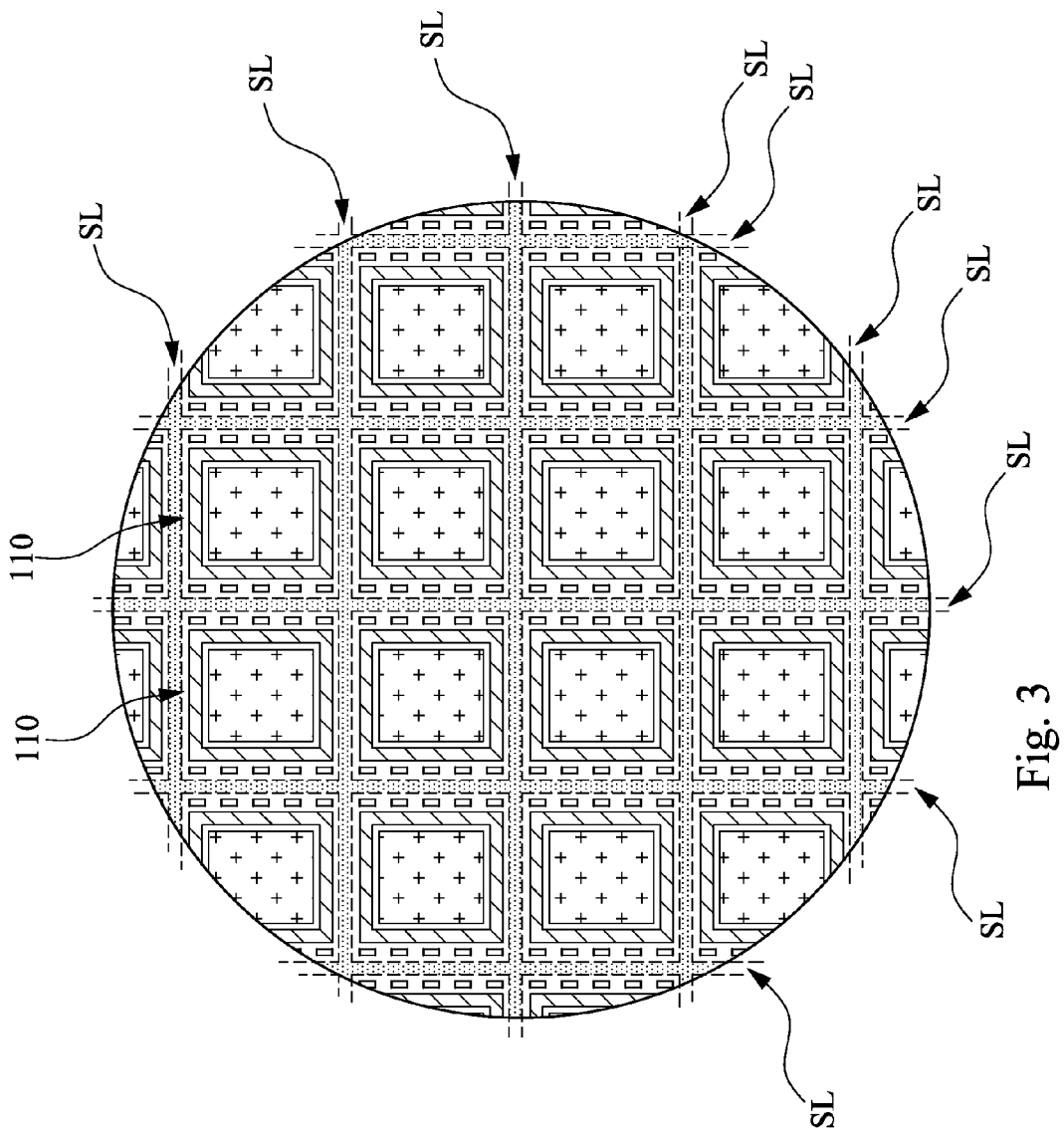
FIG. 3 is a top view of a stage in a manufacturing process in accordance with an embodiment of the instant disclosure.
Figure 4:
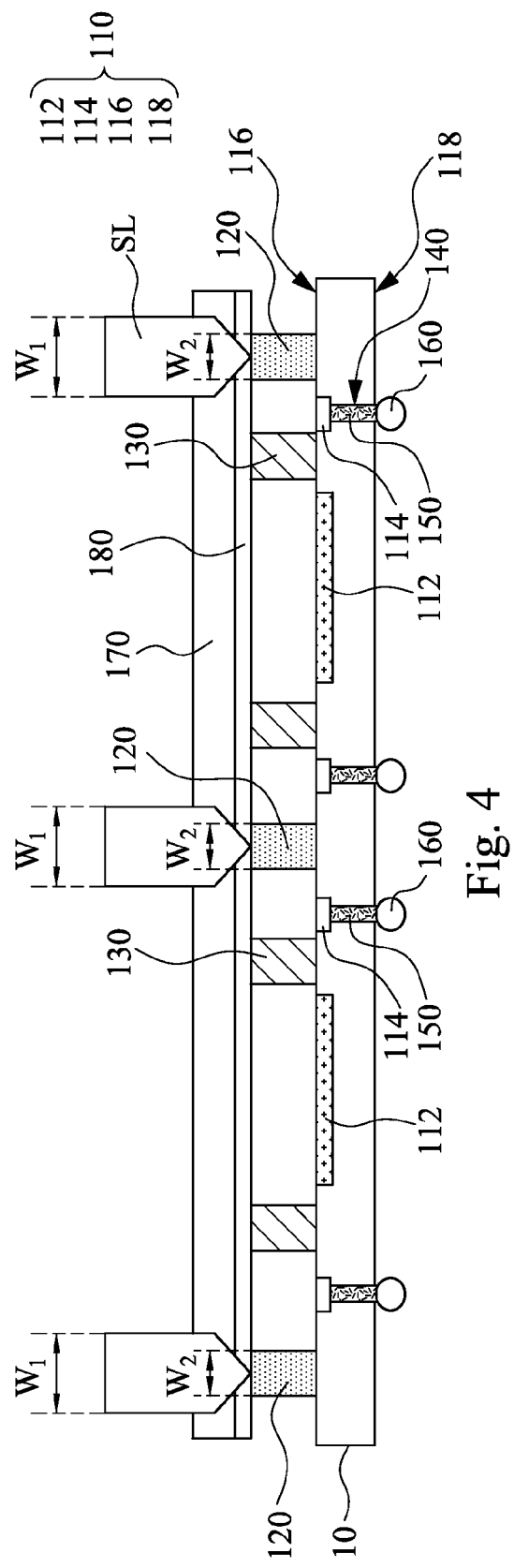

FIG. 3 shows a top view in a stage of the manufacturing process. FIGS. 4 to 6 show cross-sectional views of different stages in the manufacturing process in accordance with an embodiment of the instant disclosure. Please refer to FIG. 3 in conjunction with FIG. 4. After the formation of the solder balls 160 on the lower surface 118, the semiconductor chips 110 are cut along a plurality of cutting lines SL so as to separate each semiconductor 110. As shown in FIG. 4, the outer spacer 120 and the inner spacers 130 are separate from each other. As a result, when the semiconductor chips 110 are cut, the electronic component 112 is undisturbed within the compartment defined by the protection lid 170 and the inner spacers 130. That is to say, the electronic component 112 is free from dopant or other contaminant in dicing. In addition, because the outer spacer 120 and the inner spacers 130 are independent structure, the outer spacer 120 as well as the inner spacers 130 can provide mechanical supporting force during dicing. In short, the electronic component 112 of the semiconductor chip 110 is under thorough protection. Furthermore, as shown in FIG. 4, a predetermined width $W_1$ of the cutting lines SL is larger than a width $W_2$ of the outer spacer 120. In more detail, the width $W_2$ of the outer spacer 120 should reflect the width $W_1$ of the cutting lines SL. In other words, the width $W_2$ of the outer spacer 120 should be smaller than the width $W_1$ of the cutting lines SL. Accordingly, the outer spacer 120 can be completely removed or remain scarce amount after cutting such that the dicing is more simplified, and residue attachment and occurrence of missing corner are minimized. After dicing, the semiconductor chips 110 are shown in FIG. 5.

Please refer to FIG. 6. After dicing the semiconductor wafer 10 along the cutting lines SL to single out each of the semiconductor chips 110, the protection lid 170 is removed. As described previously, when dicing the semiconductor chips 110 along the cutting lines SL, the electronic component 112 of the semiconductor chip 110 is in the compartment created by the protection lid 170 and the inner spacers 130 such that the dust or contaminant generated in the cutting process cannot make contact with the electronic component 112. The protection lid 170 can be removed according to production need after dicing, and two independent chip packages 200 are shown in FIG. 6.

Please refer to FIG. 6. According to an embodiment of the instant disclosure, a chip package 200 is provided. The chip package 200 includes a semiconductor chip 110, inner spacers 130, cavities 140, conductive portions 150 and solder balls 160. The semiconductor chip 110 has an electronic component 112 and conductive pads 114 disposed on an upper surface 116 of the semiconductor chip 110. The conductive pads 114 are arranged abreast to one side of the electronic component 112 and electrically connected thereto. The inner spacers 130 are disposed on the upper surface 116 and surround the electronic component 112. The cavities 140 open to a lower surface 118 of the semiconductor chip 110 and extend toward the upper surface 116 to expose the conductive pad 114 on the upper surface. The conductive portions 150 fills the cavities 140 from the lower surface 118 and are electrically connected to the conductive pads 114. The solder balls 160 are disposed on the lower surface 118 and electrically connected to the conductive portions 150. The material and method of manufacturing of the semiconductor chip 110, electronic component 112, conductive pads 114, inner spacers 130, cavities 140, conductive portions 150 and solder balls 160 are identical to the abovementioned and omitted herein to avoid repetition. It should be noted that a gap D is created between an outer wall of the inner spacer 130 to an edge of the semiconductor chip 110. In other words, the outer wall of the inner spacer 130 is disposed away from the edge of the semiconductor chip 110 instead of aligning with the edge. In this way, the inner spacers 130 are closer to the electronic component 112 which leads to improved protection. As described previously, the electronic component 112 may be a light sensitive element. Because of the gap D between the inner spacer 130 and the edge of the semiconductor chip 110, the removal of the protection lid 170 can be carried out much easier. The inner spacers 130 have thermal curing, UV curing material or the combination thereof. The thermal curing material may be epoxy. The inner spacer 130 can also be transparent or disposed on top of the electronic component 112 with suitable pattern and dimension given that it does not affect the operation of the electronic component 112. Alternatively, the inner spacers 130 may be disposed on the blank area where the electronic component 112 is not present. As shown in FIG. 6, the inner spacers 130 are disposed between the electronic component 112 and the conductive pads 114 such that the operation of the electronic component 112 will not be interfered and at the same time the inner spacers 130 are closer to the electronic component 112 for exerting its protection mechanism.

In summary, the chip package in accordance with an embodiment of the instant disclosure includes separate outer and inner spacers. That is to say, the outer spacer and the inner spacers are independent structure disconnected from each other. The outer spacer is disposed in between each of the semiconductor chips to separate them on the wafer. The position of the outer spacer also corresponds to the cutting line where the cutting knife will pass. Each of the semiconductor chips has inner spacers surrounding the electronic component thereon. The outer spacer provides supporting force against mechanical strength, and the inner spacers also act the same role in the manufacturing process. As a result, the electronic component is under thorough protection. The width of the outer spacer is matched by the predetermined width of the cutting line. In this regard, the outer spacer can be removed altogether or leave little residue when undergoing cutting. The cutting process is therefore simplified, and impurity attachment or missing corner in cutting is unlikely to happen.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
   a semiconductor chip having at least an electronic component and at least an electrically conductive pad disposed on an upper surface of the semiconductor chip, the conductive pad arranged abreast to one side of the electronic component and electrically connected to the electronic component;
   an inner spacer disposed on the upper surface and surrounding the electronic component;
   a cavity opening on a lower surface of the semiconductor and exposing the conductive pad that is disposed on the upper surface;
   a conductive portion filling the cavity and electrically connected to the conductive pad; and
   a solder ball disposed on the lower surface and electrically connected to the conductive portion,
   wherein a gap is created between one side of the inner spacer and an edge of the semiconductor chip.

2. The chip package of claim 1, wherein the inner spacer is disposed between the electronic component and the conductive pad.

3. The chip package of claim 1, wherein the inner spacer is made of a thermal curing material, a UV curing material or the combination thereof.

4. The chip package of claim 3, wherein the thermal curing material is epoxy.

5. The chip package of claim 1, wherein the electronic component is a light sensitive element.

6. A wafer level chip package, comprising:
a semiconductor wafer having a plurality of semiconductor chips, the semiconductor chips arranged in an array, each of the semiconductor chip having at least an electronic component and at least an electrically conductive pad disposed on an upper surface of the semiconductor chip, the conductive pad arranged at one side of the electronic component and electrically connected to the electronic component;
an outer spacer disposed on the semiconductor wafer, the outer spacer separating each of the semiconductor chips;
a plurality of inner spacers respectively disposed on each of the semiconductor chips and surrounding the electronic component;
a protection lid disposed on the outer and inner spacers;
a plurality of cavities opening on a lower surface of the semiconductor chip and exposing the conductive pad that is disposed on the upper surface;
a plurality of conductive portions filling the cavities and electrically connected to the conductive pads; and
a plurality of solder balls disposed on the lower surface and electrically connected to each of the conductive portions,
wherein the outer spacer and the inner spacers are separate.

7. The wafer level chip package of claim 6, further comprising an adhesive layer sandwiched between the protection lid and the outer and inner spacers.

8. The wafer level chip package of claim 7, wherein the adhesive layer has UV glue.

* * * * *